United States Patent [19]

Elliott

[11] Patent Number: 4,701,422

[45] Date of Patent: Oct. 20, 1987

[54] METHOD OF ADJUSTING THRESHOLD VOLTAGE SUBSEQUENT TO FABRICATION OF TRANSISTOR

[75] Inventor: Kenneth R. Elliott, Newbury Park, Calif.

[73] Assignee: Rockwell International Corporation, El Segundo, Calif.

[21] Appl. No.: 848,514

[22] Filed: Apr. 7, 1986

[51] Int. Cl.$^4$ .................. H01L 21/265; H01L 21/322
[52] U.S. Cl. .......................................... 437/8; 357/91; 437/29; 437/44; 437/45; 148/DIG. 84
[58] Field of Search ............... 29/571, 576 B; 148/1.5, 148/187; 357/91

[56] References Cited

U.S. PATENT DOCUMENTS

| | | | |
|---|---|---|---|
| 4,244,097 | 1/1981 | Cleary | 29/571 |
| 4,452,646 | 6/1984 | Zuleeg | 148/1.5 |
| 4,469,528 | 9/1984 | Berth et al. | 148/1.5 |
| 4,473,939 | 10/1984 | Feng et al. | 29/571 |
| 4,558,509 | 12/1985 | Tiwari | 29/576 B |
| 4,606,113 | 8/1986 | Rode | 29/571 |

FOREIGN PATENT DOCUMENTS

| | | | |
|---|---|---|---|
| 0194431 | 11/1984 | Japan | 148/DIG. 84 |
| 0047428 | 3/1985 | Japan | 148/DIG. 84 |

OTHER PUBLICATIONS

Zavada et al., Jour. Appl. Phys. 57 (1985) p. 2299.
Zavada et al., Jour. Appl. Phys. 58 (1985) 3731.
Flahive, et al., A GaAs DCFL Chip Set for Multiplex and Demultiplex Applications at Gigabit/sec Data Rates, IEEE GaAs IC Symposium, p. 7 (1984).
Kasahara, et al., The Effect of Channeling on the LSI-- Grade Uniformity of GaAs-FETs by Ion Implantation, IEEE GaAs IC Symposium, p. 37 (1985).
Rode, et al., A High Yield GaAs Gate Array Technology and Applications, IEEE GaAs IC Symposium, p. 178 (1983).

*Primary Examiner*—Upendra Roy
*Attorney, Agent, or Firm*—H. Frederick Hamann; Craig O. Malin; John J. Deinken

[57] ABSTRACT

A method of adjusting the threshold voltages of field effect transistors fabricated on a III–V compound semi-insulating wafer includes the steps of measuring the threshold voltages of the transistor, directing an ion beam at the wafer to selectively damage the channels of the transistors, thereby shifting the threshold voltages to an interim value, and annealing the wafer at a temperature and for a time sufficient to stabilize the threshold voltages at a predetermined optimum value determined by the intensity and duration of the ion beam implantation. The III–V compound semi-insulating wafer may be GaAs. The ion beam may be supplied as protons accelerated to approximately 320 KeV with a concentration of between approximately $10^{11}$ and $10^{13}$ protons/cm$^{-2}$. The wafer may be annealed at a temperature from approximately 100° C. to approximately 300° C. (for approximately one half hour at 300° C. The field effect transistors may be depletion mode or enhancement mode field effect transistors. In addition, the field effect transistors may initially be depletion mode field effect transistors, but the intensity and duration of the directed ion beam may be made sufficient to convert the transistors into enhancement mode transistors.

16 Claims, 9 Drawing Figures

METHOD OF ADJUSTING THRESHOLD VOLTAGE SUBSEQUENT TO FABRICATION OF TRANSISTOR

BACKGROUND OF THE INVENTION

This invention is concerned with techniques for ensuring uniform threshold voltages among multiple field effect transistors (FETs) fabricated on different III–V compound semi-insulating wafers or in different processing lots.

III–V compound integrated circuit technology has matured rapidly, demonstrating large scale (LSI) complexity, gigabit clock rates, and a radiation hardness which surpasses that of silicon-based circuits. This advanced digital circuit technology is based upon the unique high electron mobility and semi-insulating properties of III–V materials. The capability of producing manufacturing quantities of high quality III–V integrated circuits, however, depends on the development of acceptable manufacturing circuit design rules, manufacturing approaches, and process controls.

In LSI and VLSI (very large scale) integrated circuits, the uniformity and reproducibility of FET threshold voltages is critical to successful production and operation. In the manufacturing environment, the threshold voltage should not vary among depletion mode (normally on) devices by more than 100 mV. The requirement is even more stringent for enhancement mode (normally off) logic, in which the threshold voltage variation cannot exceed 50 mV from wafer to wafer. The threshold voltage of a field effect transistor is controlled by the impurity profile which results following ion implantation and annealing. Changing the implant energy and dose changes the distribution and magnitude of the donor profile and, hence, the threshold voltage of the FET. Due to variations in the starting materials and in the prior art processes which are used, GaAs (gallium arsenide) FET threshold voltage variations from wafer to wafer often exceed the acceptable limits, leading to reduced device yields and higher production costs.

The most common method which has been used in the prior art to adjust threshold voltages is to fabricate a recessed-gate device. In this approach, the III–V wafer surface is etched in the channel area of a FET prior to applying the gate metallization. The consequent removal of charge carriers in the etched material shifts the threshold voltage. The drain-source current for the FET is monitored during the etching process to detect the point when the proper threshold is reached. This method has also been used in producing enhancement mode devices. The etching method, however, is time consuming and thus not suitable for a manufacturing environment. In addition, this method is not sufficiently controllable, particularly if a wet chemical etch is used to form the recess.

SUMMARY OF THE INVENTION

The invention provides a method of adjusting the threshold voltages of field effect transistors fabricated on a III–V compound semi-insulating wafer. The method includes the steps of measuring the threshold voltages of the transistor, directing an ion beam at the wafer to selectively damage the channels of the transistors, thereby shifting the threshold voltages to an interim value, and annealing the wafer at a temperature and for a time sufficient to stabilize the threshold voltages at a predetermined optimum value determined by the intensity and duration of the ion beam implantation.

In more particular embodiments, the III–V compound semi-insulating wafer may be GaAs. The ion beam may be supplied as protons accelerated to approximately 320 KeV with a concentration of between approximately $10^{11}$ and $10^{13}$ protons/cm$^{-2}$. The wafer may be annealed at a temperature from approximately 100° C. to approximately 300° C. The anneal time is approximately one half hour at 300° C.

Furthermore, the field effect transistors may be depletion mode or enhancement mode field effect transistors. In addition, the field effect transistors may initially be depletion mode field effect transistors, but the intensity and duration of the directed ion beam may be made sufficient to convert the transistors into enhancement mode transistors.

DESCRIPTION OF THE DRAWINGS

Additional details of the invention are described below in conjunction with the drawings, in which the same numerals are used to refer to like elements throughout all the figures. In the drawings.

DESCRIPTION OF THE INVENTION

It is an outstanding feature of this invention to use an ion beam implantation to selectively damage the channel of a III–V compound field effect transistor and thereby effect a calculated, shift in the threshold voltage of the transistor. Since the damage induced by the implanation will not remain static at elevated temperatures (100° C. to 300° C.), the threshold voltage is stabilized by subsequently annealing the transistor at a relatively low temperature.

A conventional process for fabricating a field effect transistor on a semi-insulating GaAs substrate, modified by the technique of this invention, is illustrated in FIGS. 1–7. Although the process is illustrated for a single transistor, those skilled in the art will appreciate that it is applicable as well to a production environment in which a large number of transistors on each wafer in a production lot of wafers are processed simultaneously. The process begins with a semi-insulating GaAs wafer substrate 10, which is shown in a cross-sectional view in FIG. 1. An insulating layer 12 of Si$_3$N$_4$ is deposited on the surface of the wafer. Photolithographic techniques are used to deposit a first mask layer 14 of photoresist and open up the photoresist layer over the channel region of the FET. An n$^-$ ion implant, indicated by the arrows 16, is performed to define the channel region in the substrate 10.

Figure 1:
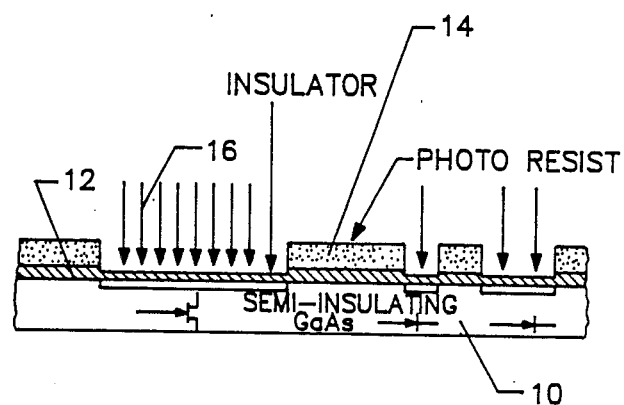
FIGS. 1–7 are cross-sectional side view illustrating consecutive steps in a process for fabricating a field effect transistor on a semi-insulating GaAs substrate.
Figure 2:
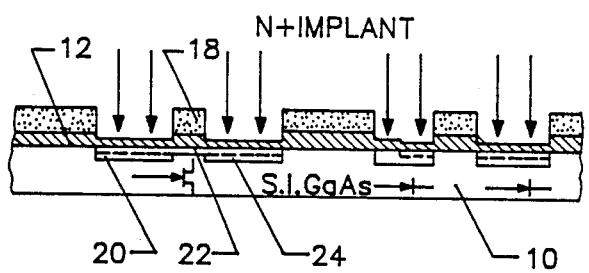
Figure 3:
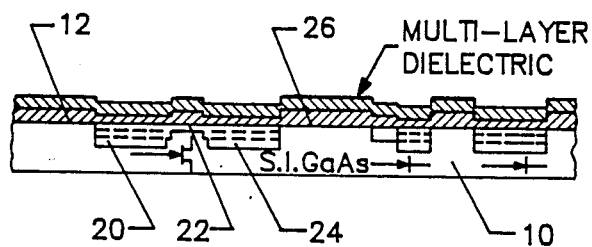

As shown in FIG. 2, photolithographic techniques are then used to establish a second mask layer 18 of photoresist. An n$^+$ implant through the second mask defines the source 20, gate 22, and drain 24 regions of the FET. As illustrated in FIG. 3, the second mask layer is removed, a multilayer dielectric overcoat 26 is deposited, and the device is annealed at a high temperature (typically greater than 800° C.) to activate the FET. The threshold voltage for the device before the high temperature anneal is indeterminate, since there are then no conducting electrons in the device. The high temperature annealling step, together with the preceding ion implants, creates an active conducting layer in the device. The implanation dose is determined by trial and error, through experience on similar prior devices. The reproducibility of the threshold voltage which is achieved after the high temperature anneal depends on day to day implanter reproducibility, variations in the starting material, contamination introduced in the process, and other more subtle effects. As a result, the threshold voltage usually varies significantly from wafer to wafer or from lot to lot at this point in the process. Moreover, the threshold voltage cannot be measured after the high temperature anneal, but can be estimated by measuring the conduction following the initial high temperature annealing step. An accurate measurement can only be accomplished on finished devices.

Figure 4:
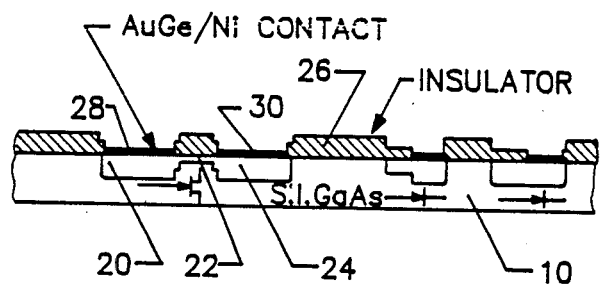
Figure 5:
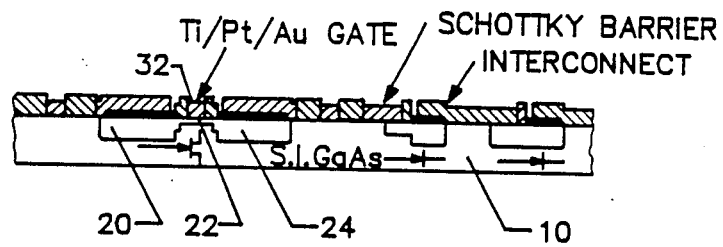

In the steps depicted by FIG. 4, additional photolithography is used to open windows in the dielectric layer 26 and ohmic metal AuGe/Ni contacts 28 and 30 are deposited on the source and drain of the FET. The metal is patterned by conventional photolithographic liftoff technology and contacts are formed by an alloying procedure. As shown in FIG. 5, a Schottky metal Ti/Pt/Au gate contact 32 is then deposited over the gate 22 of the FET and patterned by a liftoff process. The threshold voltage may be measured for selected test FETs at this point.

Figure 6:
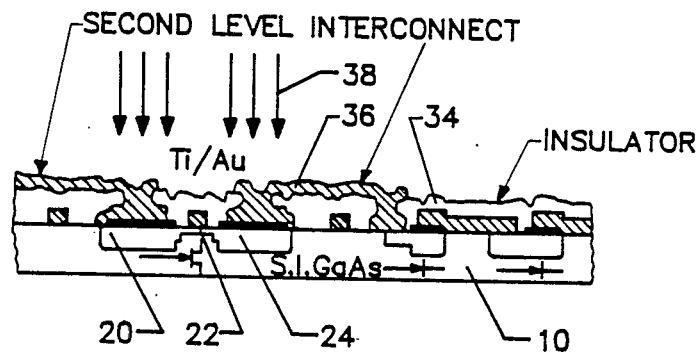
Figure 7:
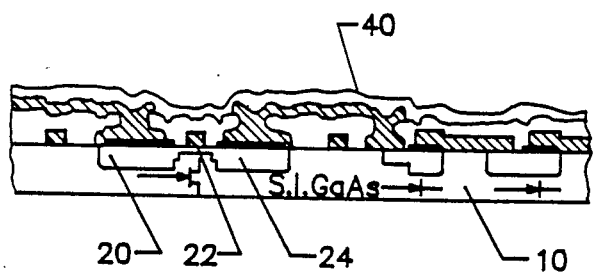

An insulator layer 34 is deposited as depicted in FIG. 6. The insulator layer is then removed in the appropriate regions and the Ti/Au second layer metallization 36 is deposited. Another photolithographic mask is applied and the second layer metal is selectively removed to define interconnects and contacts.

At any point in the process following the Schottky metal deposition shown in FIG. 5, the conventional fabrication steps are modified by the addition of the process steps of the present invention so that the threshold voltage of the FET can be adjusted to a predetermined optimum value. In the procedure of the present invention, the threshold voltage of the FET is first measured. Typically, measurements are obtained indicating the average threshold voltage and standard deviation in the threshold voltage for all the FETs on a wafer. An ion beam is then directed at the wafer, as indicated by the arrows 38, to selectively damage the channels of the FETs. The intensity and duration of the ion beam implanation are selected so that this implanation will shift the threshold voltage to an interim value. The wafer is then annealed at a relatively low temperature (from 100° C. to 300° C.) long enough (approximately one half hour at 300° C.) to stabilize the threshold voltage at a predetermined optimum value. Empirical measurements provide an indication of the proper ion beam intensity and duration to use in order to shift the threshold voltage by the desired amount so that the annealing step will leave the FET with a final threshold voltage value at the desired optimum value. These implanation and annealing steps remove charge carriers from the channel by producing damage, thereby shifting the threshold voltage. Since carriers are already present, this threshold shift can be measured. The low temperature anneal stabilizes the damage so that the threshold shift will be permanent and constant. The initial channel implant anneal is at a very high temperature but, since the device metallization commonly degrades at temperatures above 300° C., the threshold adjusting anneal is carried out at a much lower temperature, typically 250°-300° C. It has been determined that the threshold voltage does not need to be monitored during this second implanation. Although the voltage can be monitored, the reproducibility of the technique is good enough that monitoring is not necessary, once the relationship between the dosage energy and intensity and the resulting shift in the threshold voltage has been empirically established.

After the threshold voltage has been adjusted, a scratch cover 40 is applied over the device to provide physical protection for the underlying circuitry. Lithography is then used to expose bond pads for the necessary electrical contact points to the device. The present invention makes it feasible to adjust the threshold voltages for all the FETs on a wafer or a lot of wafers without the necessity for a tedious process such as etching the surface of the semi-insulating substrate in the channel region of each FET. It has been found that the uniformity of the threshold voltage across a wafer is sufficiently high that only wafer to wafer or lot to lot adjustment is necessary with the present invention.

Tests of this technique have shown that it is possible to controllably shift the threshold voltages of depletion mode FETs to desired values. Depletion mode devices which have been trimmed using this technique do not suffer from a large reduction in transconductance. The tests also revealed that enhancement mode devices could be produced from depletion mode devices using the technique. Enhancement mode devices fabricated using this technique exhibit device characteristics similar to those of devices fabricated using recessed gates. It was found that the low temperature anneal renders the implanation damage stable for long periods at relatively high storage temperatures. In addition, by using appropriate ions at the proper energy, the threshold can be shifted by implanation through the gate metallization of FET devices. For these tests, the ions used were protons which were accelerated to 320 KeV and supplied in an integrated dose ranging from $1 \times 10^{11} - 1 \times 10^{13}$ cm$^{-2}$. At this energy the proton range is approximately 3 microns, which is sufficient to penetrate deposited metal and dielectric layers on the surface of the GaAs substrate. If the damage is to be selectively masked by photoresist or other masking layers, however, lower energy ions or a different ion may be used.

Figure 8:
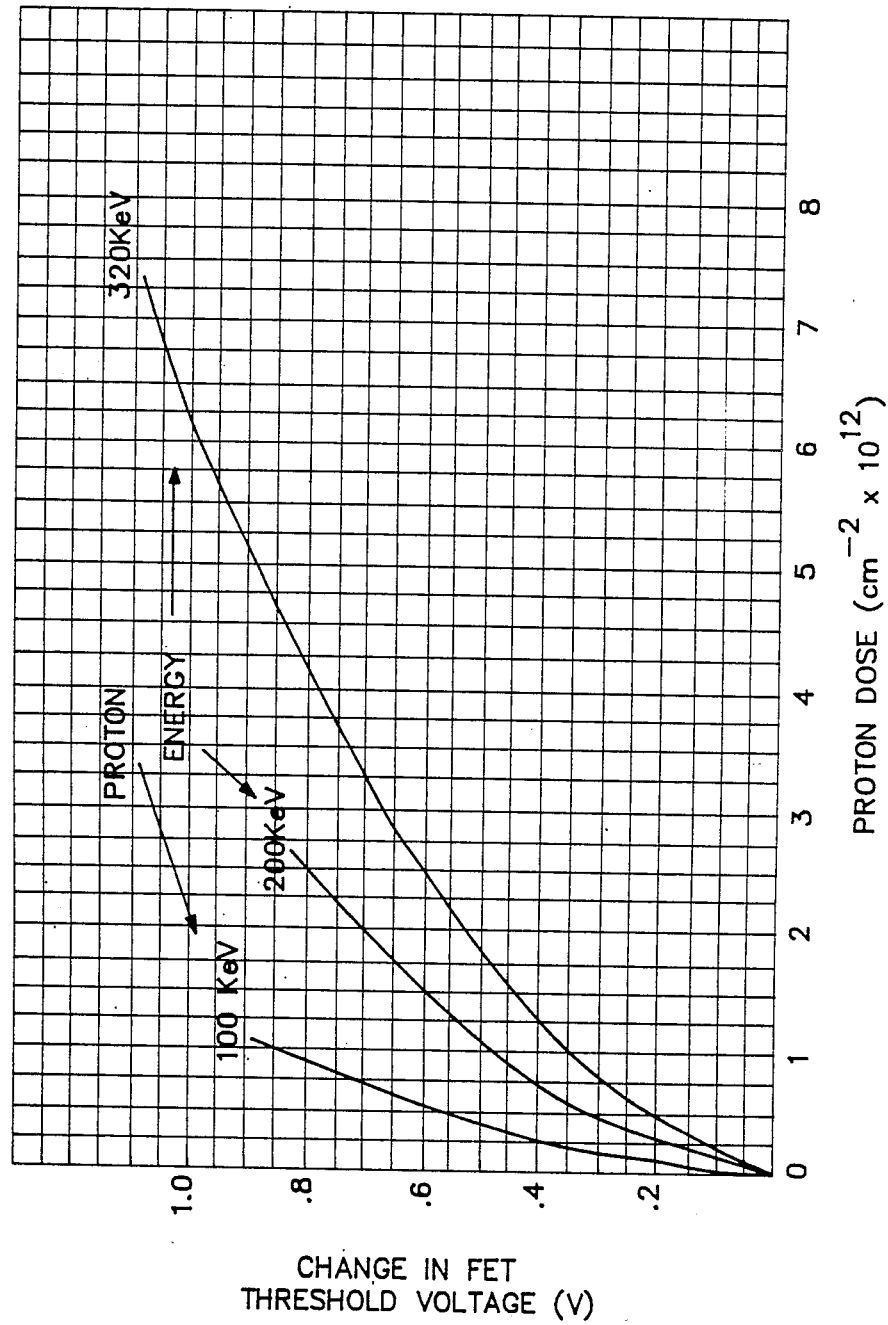
FIG. 8 is a graphical plot which illustrates changes in threshold voltage which were achieved with the method of the present invention on depletion mode GaAs MESFETS.
Figure 9:
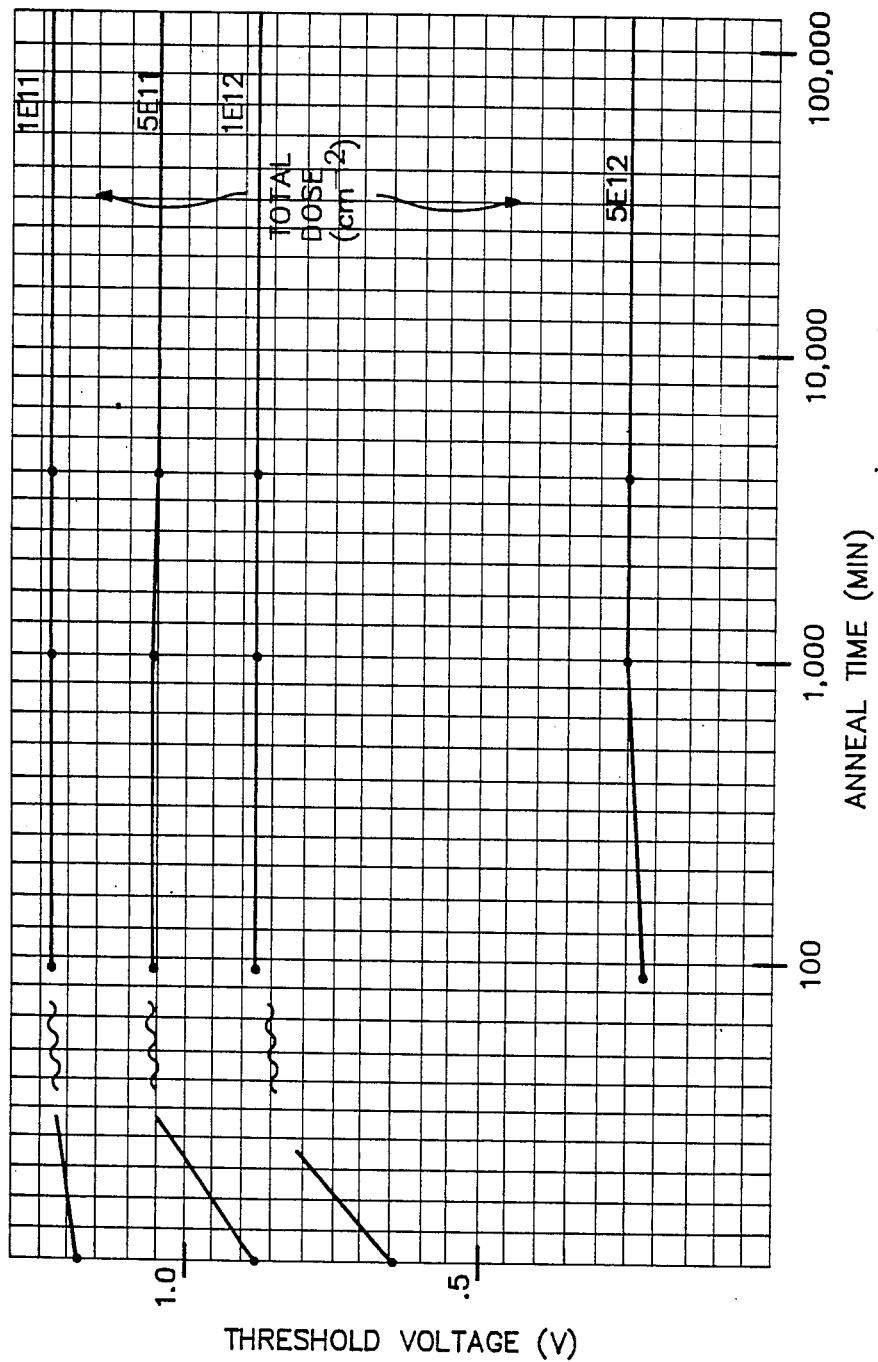
FIG. 9 is a plot of threshold voltage versus time, depicting the long term stability of the threshold voltage changes effected by the present invention.

FIG. 8 is a graphical plot which illustrates the shifts in threshold voltage which were achieved with this invention on depletion mode GaAs MESFETs (metal-semiconductor field effect transistors). The vertical axis represents the change in threshold voltage (Volts), while the horizontal axis indicates the total dosage of proton ions (in protons/cm$^{-2}$) which were implanted. Three curves are plotted, for ion implants of protons having energies of 100, 200, and 320 KeV. FIG. 9 is a plot of measured threshold voltage (Volts) on the vertical axis versus time (minutes) on the horizontal axis, indicating th long term stability of the threshold voltage which is achieved after the annealing step of this invention. Curves are provided for total proton implant dosages of $1 \times 10^{11}$, $5 \times 10^{11}$, $1 \times 10^{12}$, and $5 \times 10^{12}$ protons/cm$^{-2}$.

The preferred embodiment of this invention has been illustrated and described above. Modifications and additional embodiments, however, will undoubtedly be apparent to those skilled in the art. The advantages of this technique, for example, have been proven for GaAs semiconductor devices. The technique should also be useful, however, for other III-V semiconductor alloys and materials, such as $Al_xGa_{1-x}As$ or $In_{1-x}Ga_xAs$, which exhibit similar damage and annealing behavior where a MESFET technology is appropriate. Furthermore, equivalent elements may be substituted for those illustrated and described herein, parts or connections might be reversed or otherwise interchanged, and certain features of the invention may be utilized independently of other features. Consequently, the exemplary embodiments should be considered as illustrative, rather than inclusive, while the appended claims are more indicative of the full scope of the invention.

I claim:

1. A method of adjusting the threshold voltages of field effect transistors fabricated on a III-V compound semi-insulating wafer, comprising the steps of, subsequent to the fabrication of the transistors:

measuring the threshold voltages of the transistors;

directing an ion beam at the wafer to selectively damage the channels of the transistors, thereby shifting the threshold voltages to an interim value; and annealing the wafer at a temperature and for a time sufficient to stabilize the threshold voltages at a predetermined optimum value determined by the intensity and duration of the ion beam implanation, the annealing temperature being low enough to avoid damaging the previously fabricated transistors.

2. The method of claim 1, wherein the III-V compound semi-insulating wafer further comprises GaAs.

3. The method of claim 1, wherein the field effect transistors further comprise depletion mode field effect transistors.

4. The method of claim 1, wherein the field effect transistors further comprise enhancement mode field effect transistors.

5. The method of claim 1, wherein the field effect transistors initially comprise depletion mode field effect transistors, but wherein the intensity and duration of the directed ion beam are sufficient to convert the transistors into enhancement mode transistors.

6. The method of claim 2, wherein the ion beam further comprises protons accelerated to approximately 320 KeV with an integrated dose of between approximately $10^{11}$ and $10^{13}$ protons/cm$^{-2}$.

7. The method of claim 6, wherein the wafer is annealed at a temperature from approximately 100° C. to approximately 300° C.

8. An improved method of fabricating field effect transistors on a III-V compound semi-insulating wafer, of the type including the steps of depositing a first photolithographic mask on the wafer, defining the transistor channels with a first ion implanation, depositing a second photolithographic mask on the wafer, defining the transistor gates with a second ion implanation, annealing the wafer to activate the transistors, depositing a third photolithographic mask on the wafer, and depositing metallic contacts to the source, gate, and drain of each transistor, wherein the improvement comprises, subsequent to the step of depositing metallic contacts, the steps of:

measuring the threshold voltages of the transistors;

directing an ion beam at the wafer to selectively damage the channels of the transistors, thereby shifting the threshold voltages to an interim value; and annealing the wafer at a temperature and for a time sufficient to stabilize the threshold voltages at a predetermined optimum value determined by the intensity and duration of the ion beam implanation, the annealing temperature being low enough to avoid damaging the previously fabricated transistors.

9. The method of claim 8, wherein the III-V compound semi-insulating wafer further comprises GaAs.

10. The method of claim 8, wherein the field effect transistors further comprise depletion mode field effect transistors.

11. The method of claim 8, wherein the field effect transistors further comprise enhancement mode field effect transistors.

12. The method of claim 8, wherein the field effect transistors initially comprise depletion mode field effect transistors, but wherein the intensity and duration of the directed ion beam are sufficient to convert the transistors into enhancement mode transistors.

13. A method of adjusting the threshold voltages of field effect transistors fabricated on a GaAs semi-insulating wafer, comprising the steps of, subsequent to the fabrication of the transistors:

measuring the threshold voltages of the transistors;

directing an ion beam at the wafer to selectively damage the channels of the transistors, thereby shifting the threshold voltages to an interim value; and annealing the wafer at a temperature and for a time sufficient to stabilize the threshold voltages at a predetermined optimum value determined by the intensity and duration of the ion beam implanation, the annealing temperature being low enough to avoid damaging the previously fabricated transistors.

14. The method of claim 13, wherein the field effect transistors further comprise depletion mode field effect transistors.

15. The method of claim 13, wherein the field effect transistors further comprise enhancement mode field effect transistors.

16. The method of claim 13, wherein the field effect transistors initially comprise depletion mode field effect transistors, but wherein the intensity and duration of the directed ion beam are sufficient to convert the transistors into enhancement mode transistors.

* * * * *